United States Patent
Tachino (10) Patent No.: US 6,696,663 B2
(45) Date of Patent: Feb. 24, 2004

(54) INDUCTIVELY COUPLED PLASMA APPARATUS

(75) Inventor: Yuichi Tachino, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/265,312

(22) Filed: Oct. 7, 2002

(65) Prior Publication Data

US 2003/0141285 A1 Jul. 31, 2003

(30) Foreign Application Priority Data

Jan. 29, 2002 (JP) .......................... 2002-019753

(51) Int. Cl.[7] ................................................. B23K 9/00
(52) U.S. Cl. ............................ 219/121.54; 219/121.43
(58) Field of Search ....................... 219/121.41, 121.43, 219/121.44, 121.48, 121.36, 121.39, 121.4, 121.54, 121.56, 121.58; 156/345, 643.1, 646.1; 204/298.31, 298.37, 298.38

(56) References Cited

U.S. PATENT DOCUMENTS 5,922,223 A * 7/1999 Okumura et al. ...... 219/121.43
6,459,066 B1 * 10/2002 Khater et al. .......... 219/121.41

FOREIGN PATENT DOCUMENTS

| JP | 8-50996 | 2/1996 |
| JP | 8-148472 | 6/1996 |

* cited by examiner

Primary Examiner—Tu Ba Hoang
(74) Attorney, Agent, or Firm—Westerman, Hattori, Daniels & Adrian, LLP (57) ABSTRACT

An inductively coupled plasma apparatus which is capable of performing etching processing steps in a stable manner and consecutively. Shield plates are provided in a reaction tube in the vicinity of an inner surface thereof. The shield plates prevent a conductive material generated by etching a wafer from sticking to the overall inner surface of the reaction tube. A portion of the inner wall covered by the shield plate, that is, a region where no conductive material is deposited serves as a high-frequency window, through which high-frequency electric power is efficiently fed from a coil antenna into the reaction tube. The conductive materials thus stuck separately from each other exhibit the Faraday shield effect, thereby stabilizing plasma potential.

18 Claims, 9 Drawing Sheets

INDUCTIVELY COUPLED PLASMA APPARATUS

BACKGROUND OF THE INVENTION

The present invention relates to an inductively coupled plasma apparatus.

A semiconductor device is manufactured as follows. Firstly, a functional thin film is deposited on a semiconductor wafer by a film forming device. Then, a dry etching device is used to remove unnecessary portions from the thin film to thereby form the functional thin film having a desired pattern. When a plurality of functional thin film layers are deposited on the semiconductor wafer, the plurality of layers are etched in different processing chambers.

An inductively coupled plasma (ICP) etching apparatus is used for the etching processing of semiconductor devises. The ICP etching apparatus has a vacuum vessel made of a dielectric material and an external electrode provided around the outer periphery of the vacuum vessel. A high frequency electric power is supplied to the external electrode, whereby plasma is generated in the vacuum vessel. The thin film is etched by the plasma.

During the processing by the conventional ICP etching apparatus, etching product particles are generated. The etching product particles stick and deposit on an inner wall of the vacuum vessel every time an etching process is carried out. The temperature in the vacuum vessel is significantly different between during the etching processing and during a waiting period. The deposited etching product particles often undergo a temperature difference (heat stress), so that the deposited etching product particles peel off from the wall. Pieces of the peeled etching products drop on the semiconductor wafers. The relatively larger dropped pieces prevent the formation of the semiconductor devices having a desired pattern. In addition, the etching products deposited on the vacuum vessel causes deterioration of an etching rate owing to ignition failure of the plasma and variation of matching points.

The removal of the etching products is performed by daily washing of the vacuum vessel before the processing of articles, dry cleaning sequence scheduled after the processing, and the like. Such a cleaning step shortens an operation life and lowers an operation efficiency of the etching apparatus, which leads to the increase of an operation cost of the etching apparatus and thus a manufacturing cost of the semiconductor devices. Therefore, it has been required to develop inductively coupled plasma apparatuses which can stably and efficiently conduct the processing.

SUMMARY OF THE INVENTION

The present invention has been made to solve the above-mentioned problems, and an object of the present invention is to provide an inductively coupled plasma apparatus which can stably conduct continuous processing.

To achieve the above object, the present invention provides an inductively coupled plasma apparatus. The plasma apparatus has a reaction tube made of a dielectric material and having at least curved outer and inner surfaces, a high-frequency antenna arranged around the reaction tube for generating plasma inside the reaction tube, and at least one shield plate arranged in the reaction tube. The shield plate splits a deposition layer composed of reaction product particles to be attached on the reaction tube.

A further perspective of the present invention is a plasma etching apparatus having a cylindrical reaction tube made of a dielectric material, and a high-frequency antenna arranged to face an outer peripheral surface of the reaction tube, for generating plasma inside the reaction tube. The plasma etching apparatus further includes a plurality of shield plates which are arranged to be near an inner peripheral surface of the reaction tube so as to face at least part of the high-frequency antenna and are arranged separate from each other, and a driving device for moving at least one of the high frequency antenna and the reaction tube relative to the other.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

FIGS. 5A to 8B are modifications of the high-frequency antenna; and

FIGS. 9A to 10B are modifications of the shield.

DETAILED DESCRIPTION OF THE PREFERRED EMBODIMENTS

The following will describe an inductively coupled plasma etching apparatus 10 according to a first embodiment of the present invention.

Figure 1:
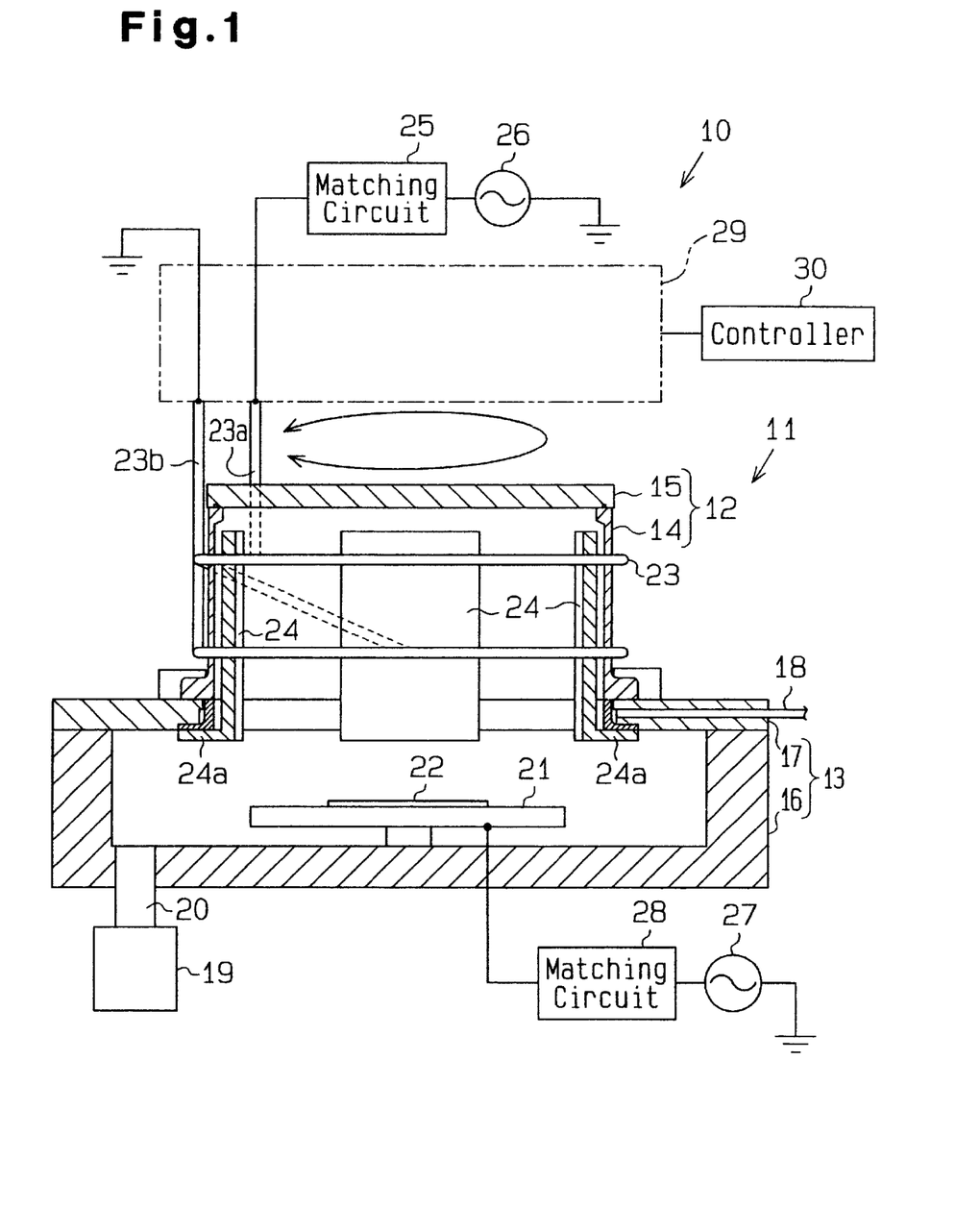
FIG. 1 is a schematic diagram of a plasma etching apparatus according to a first embodiment of the present invention.

As shown in FIG. 1, the etching apparatus 10 comprises an upper processing chamber 12 and a lower processing chamber 13. The upper processing chamber 12 is partitioned into a cylindrical dielectric reaction tube 14 made of quartz glass and a cap 15 which covers the upper end of the reaction tube 14. The lower processing chamber 13 is partitioned into a processing vessel 16 having a larger diameter than that of the reaction tube 14 and an annular cap 17 which covers the upper end of the processing vessel 16. The inner diameter of the annular cap 17 is substantially the same as that of the reaction tube 14. On the upper face of the annular cap 17, the reaction tube 14 is fixed. The upper processing chamber 12 and the lower processing chamber 13 are combined to make up an etching chamber 11.

The annular cap 17 has a gas introduction port 18 formed thereon for introducing an etching gas into the etching chamber 11. The processing vessel 16 has an exhaust port 20 formed thereon which communicates with a vacuum pump 19. The vacuum pump 19 serves to discharge molecules in plasma and etching product particles from the etching chamber 11.

The lower processing chamber 13 is provided with a stage, that is, an electrostatic chuck 21. On the upper face of the electrostatic chuck 21 is fixed a sample to be etched, that is, a wafer 22.

Figure 2A:
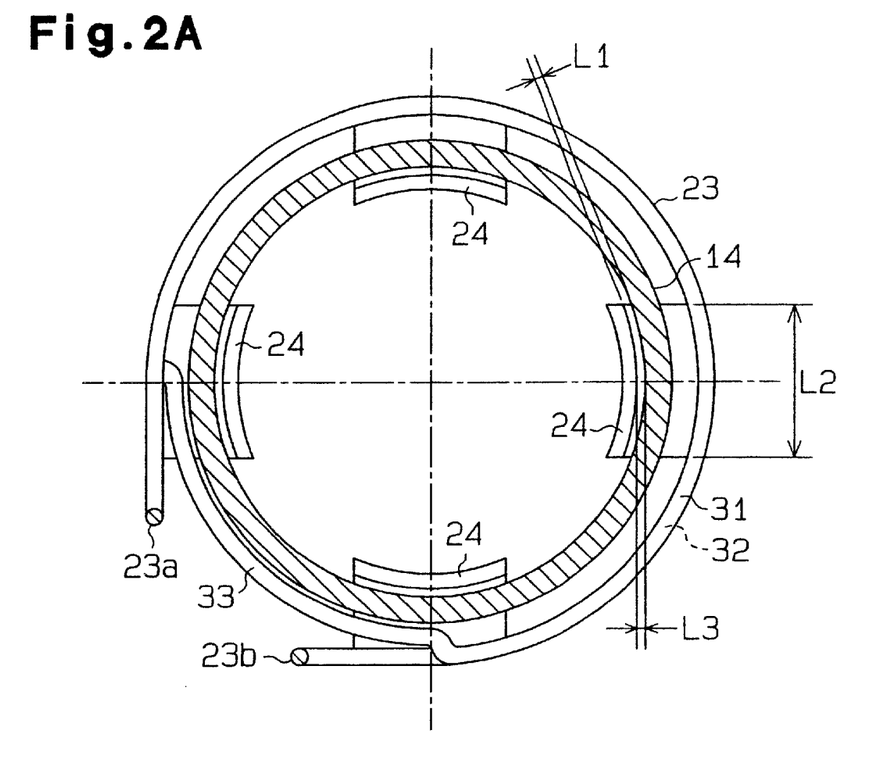
FIG. 2A is a plan view of a high-frequency antenna and a shield of the plasma etching apparatus of FIG. 1.

As shown in FIG. 2A, the reaction tube 14 is provided with a coil antenna 23 on its outer side and four shield plates 24 on its inner side.

The coil antenna 23 is wound around the reaction tube 14 by about two turns along the outer periphery of the reaction tube 14. A power supply terminal 23a of the coil antenna 23 is connected through a high-frequency impedance matching circuit 25 to a high-frequency power source 26, while a grounding terminal 23b thereof is grounded. The coil antenna 23 serves to feed power to the etching chamber 11 for generating and maintaining plasma.

The shield plates 24 are each made of quartz glass. The shield plates 24 can be made of a conductive material. The four shield plates 24 are disposed at an equal angle (90 degrees) with respect to each other so as to surround the center axis of the reaction tube 14. In the first embodiment, the four shield plates 24 are curved along the inner peripheral surface of the reaction tube 14.

Figure 2B:
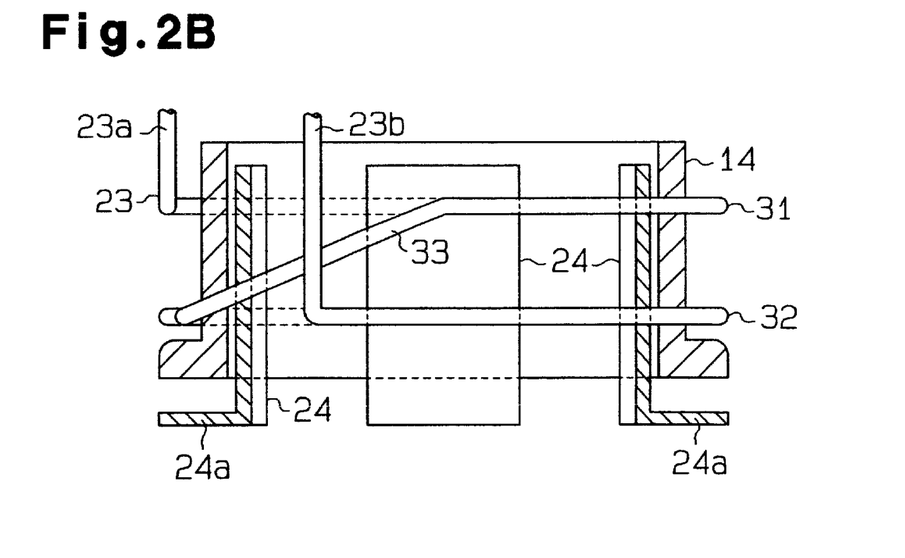
FIG. 2B is a side view of the high-frequency antenna and the shield of FIG. 2A.

As shown in FIG. 2B, each of the shield plates 24 has at its lower end a folded strip, or a fixing portion 24a, projected out radially toward the reaction tube 14. As shown in FIG. 1, by fixing the fixing portion 24a to the annular cap 17, the shield plate 24 is separated by a predetermined distance from the inner peripheral surface of the reaction tube 14 with the upper end thereof as disposed above a first winding 31.

The etching apparatus 10 has a second high-frequency power source 27 for accelerating or biasing etchant ions in plasma toward the electrostatic chuck 21. The second high-frequency power source 27 is connected to the electrostatic chuck 21 via a high-frequency impedance matching circuit 28.

The etching apparatus 10 further has a driving device 29 which moves the coil antenna 23 and a controller 30 which controls the driving device 29. The driving device 29 rotates the coil antenna 23 along the outer periphery of the reaction tube 14 horizontally to thereby move the former relatively with respect to the latter. The controller 30 supplies an operation instruction to the driving device 29 upon starting of etching of the wafer 22. In response to the operation instruction, the driving device 29 rotates the coil antenna 23 horizontally.

The following will describe the coil antenna 23.

The coil antenna 23 is comprised of first and second windings 31 and 32 arranged nearly parallel to each other with a predetermined distance therebetween and a sloped segment 33 which interconnects these windings. The first winding 31 is connected to the power supply terminal 23a, while the second winding 32 is connected with the grounding terminal 23b.

The first and second windings 31 and 32 both extend around the reaction tube 14 by about ¾ turn along its outer peripheral surface as separated therefrom by a first distance. The sloped segment 33 extends around the reaction tube 14 by about ¼ turn along its outer peripheral surface as separated therefrom by a second distance. The second distance is extremely smaller than the first distance. Accordingly, the magnitude of capacitive coupling of the sloped segment 33 in the coil antenna 23 is comparatively large.

Although inductively coupled, the coil antenna 23 has a finite length and so has some capacitive coupling. Its magnitude decreases from the power supply terminal 23a toward the grounding terminal 23b if the distance between the coil antenna 23 and the reaction tube 14 is not changed. As the sloped segment 33 is brought closer to the outer periphery of the reaction tube 14, the magnitude of the capacitive coupling at the sloped segment 33 becomes larger than those of the first and second windings 31 and 32. Furthermore, the second distance is by far smaller than the first distance and the distance between the sloped segment 33 and the reaction tube 14 is nearly constant over a range from the upper end of the sloped segment 33 (terminating end of the first winding 31) to its lower end (tip of the second winding 32). Accordingly, the magnitude of the capacitive coupling of the sloped segment 33 is nearly uniform over a range from its upper end to its lower end.

The following will describe the shield plates 24.

As shown in FIG. 2A, a plurality of (four) shield plates 24 are arranged as separated from each other in a direction of the circumference of the reaction tube 14. This layout causes part of etching product particles to be deposited on the shield plates 24 and the rest thereof to be stuck to the reaction tube 14. The inner surface of the reaction tube 14 is divided into four first regions (slits) where no etching product is deposited and the other four regions (sticking regions) where the etching product particles are deposited locally. Each of the slits is formed between the two adjacent ones of the four sticking regions, which are separated from each other in the circumferential direction on the inner surface of the reaction tube 14.

Each of the shield plates 24 is separated at its circumferential edges from the inner surface of the reaction tube 14 by a distance L1. The distance L1 is determined so that an etching product deposited on the shield plates 24 may not come in contact with that deposited on the reaction tube 14. Part of the etching product goes around the circumferential edges of the shield plate 24 into a gap between itself and the reaction tube 14. A width L2 of each of the shield plates 24 is set so that the etching product entered from one of the circumferential edges of each of the shield plates 24 and that entered from the other edge may not come in contact with each other (may not be linked with each other). A distance L3 between the reaction tube 14 and the center of each of the shield plates 24 in the width direction is set so that the plasma power for etching may not be decreased.

The following will describe actions of the etching apparatus 10.

A gas introduced through the gas introduction port 18 into the etching chamber 11 and conductance of the vacuum pump 19 and that of the exhaust port 20 produce a desired atmosphere therein. When the gas atmosphere in the etching chamber 11 has become stable, the first high-frequency power source 26 serving as a source feeds power to the coil antenna 23 to oscillate an electromagnetic wave from the coil antenna 23. This electromagnetic wave causes the molecule and atom of the gas in the reaction tube 14 to be ionized, thus providing a plasma state.

In response to the operation of the first high-frequency power source 26, the controller 30 activates the driving device 29, thus rotating the coil antenna 23 horizontally.

After the plasma has become stable to produce a sufficient amount of ions, the second high-frequency power source 27 feeds biasing power to the electrostatic chuck 21. Then, the wafer 22 is etched off due to the ion assist reaction and the ion bombardment. This etching processing starts at the same time as the bias power is fed or thereafter, so that the controller 30 may activate the driving device 29 upon oscillation by the second high-frequency power source 27.

Such materials used in devices including a FeRAM (Ferro-electric Random Access memory) as platinum (Pt), iridium (Ir), lead zirconic titanate (PZT) and strontium bismuth tantalate (SBT) have extremely low reactivity with all the etchants. Accordingly, these materials are etched mostly by sputtering due to ion bombardment. By this etching, no volatile molecules are generated, so that etching product particles mostly consist of atoms removed from the wafer 22. These atoms stick to the inner wall of the etching chamber 11, that is, the inner wall of the reaction tube 14.

The inner wall of the reaction tube 14 that faces the sloped segment 33 has an ion sheath formed thereon owing to capacitive coupling. Only a small amount of the ions in the plasma moves from the etching chamber 11 toward the coil antenna 23 to hit the inner wall of the reaction tube 14. The ion sheath is formed not only on the reaction tube 14 near the coil antenna 23 but also on a vicinity of a dielectric that transmits the oscillated electric wave.

The etching product particles moving toward the inner wall of the reaction tube 14 collide with the ions accelerated by the ion sheath and are diffused. As a result, less etching product particles stick to the vicinity of the coil antenna 23.

The sloped segment 33 has nearly a uniform magnitude of capacitive coupling over a range from its upper end to its lower end. The etching product, therefore, is nearly uniformly diffused over a range from the upper to the lower end of the coil antenna 23 and sticks to the reaction tube 14 nearly uniformly in amount.

As the ion sheath expands, the amount of the ions moving toward the reaction tube 14 increases. The density of ions produced by ICP, however, is very high, so that the amount of the ions moving toward the wafer 22 does not so much decrease as to affect an etching rate.

The following will describe actions of the shield plates 24.

Figures 3A, 3B:
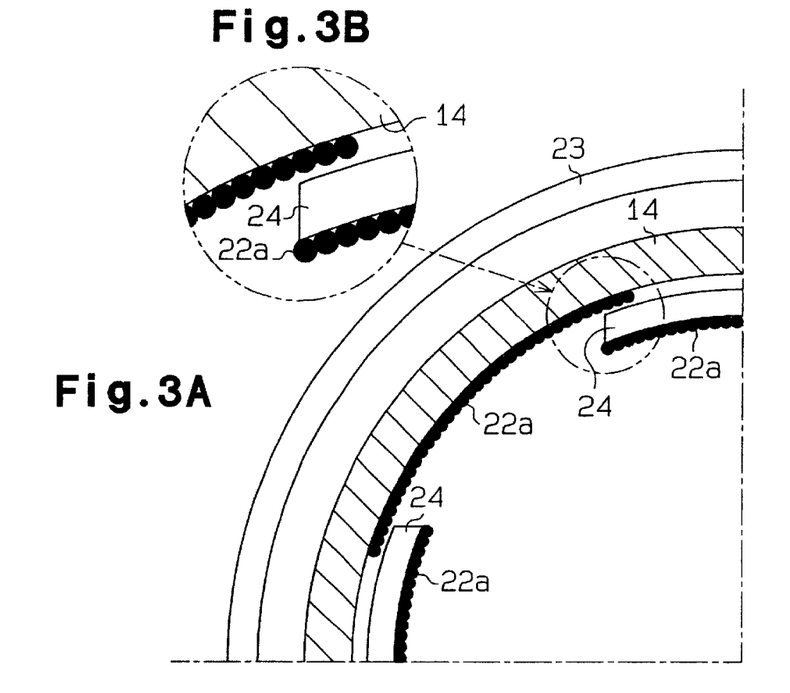
FIG. 3A is a cross-sectional view of a vacuum vessel having a shield.
FIG. 3B is a partially enlarged diagram of the shield shown in FIG. 3A with etching product particles stuck thereto.
Figure 3C:
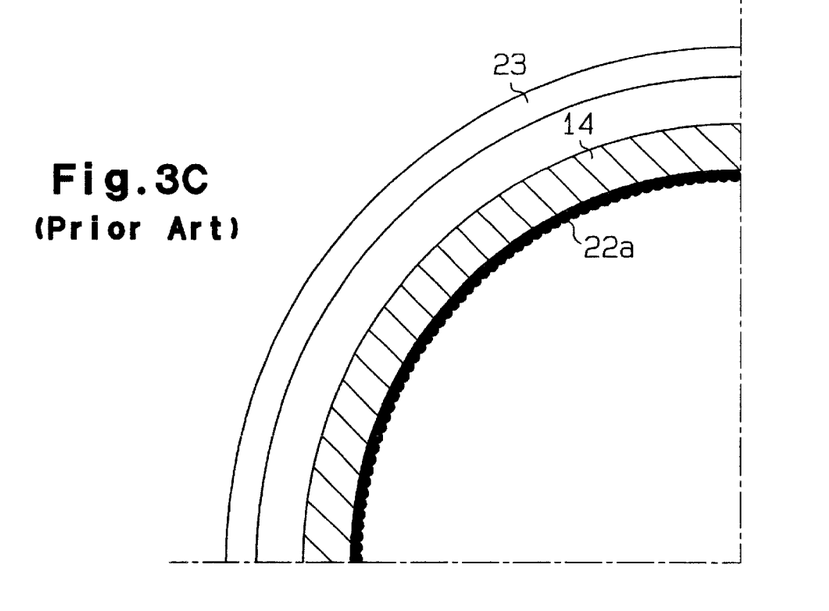
FIG. 3C is a cross-sectional view of a conventional vacuum vessel having no shield.

FIG. 3C shows a conventional reaction tube 14 having no shield plates. According to the conventional technology, when a metal film deposited on the substrate is etched, a conductive etching product 22a sticks to the inner surface of the reaction tube 14. By repeating the etching processing consecutively, the etching products 22a form a deposition layer on the entire inner surface of the reaction tube 14. That is, the etching product 22a becomes continuous circumferentially on the inner surface of the reaction tube 14.

According to the first embodiment, on the other hand, the shield plates 24 are each arranged vertically so as to intersect with the coil antenna 23. The etching products 22a are attached and deposited on the shield plates 24 and the reaction tube 14. As shown in FIG. 3A, the deposition layers formed on the shield plates 24 are split from the deposition layers formed on the reaction tube 14 by the shield plates 24. The shield plates 24 each covers part of the inner surface of the reaction tube 14, thus forming a plurality of sticking regions separated from each other circumferentially on the inner surface of the reaction tube 14.

If the distance L1 (see FIG. 2A) is too small, as the etching product 22a is deposited increasingly in amount, some of the etching product 22a stuck to the shield plate 24 and the rest stuck to the reaction tube 14 (see FIGS. 3A and 3B) come in contact with each other, thus forming a belt of the etching product 22a continuously extending in a circumferential direction of the reaction tube 14. If the distance L1 is too large, on the other hand, the etching product 22a goes around into a gap between the shield plate 24 and the reaction tube 14 to thereby stick to the reaction tube 14 on the back side of the shield plate 24 (see FIG. 2B). In such a case, if the width L2 of the shield plate 24 is too small, the etching products 22a entered around the two edges of the shield plate 24 respectively and stuck to the reaction tube 14 link with each other on the back side of the shield plate 24, thus forming a belt made thereof continuously extending in the circumferential direction of the reaction tube 14. Thus, the distances L1 and L2 are set so that the belt of the etching products 22a may not be formed, that is, so that a plurality of sticking regions may be separated from each other.

If the distance L3 between the center of the shield plate 24 and the reaction tube 14 is too large, plasma occurs between the reaction tube 14 and the shield plate 24, thus decreasing the power of plasma which contributes to the processing of etching. Accordingly, setting of the distance L3 is also important.

The etching product 22a adhered to the reaction tube 14 is divided (or split) by the shield plates 24 into a plurality of mutually separated sticking regions on the inner surface of the reaction tube 14, thus forming slits where no etching product 22a is adhered. These slits each function as a high-frequency window through which high-frequency power is fed into the reaction tube 14 from the coil antenna 23. In the etching apparatus 10 according to the first embodiment, the shield plates 24 cause the etching product 22a to be deposited on the reaction tube 14 so as to form the high-frequency windows, thus suppressing a decrease in power of the plasma that contributes to etching.

The etching product 22a has conductivity. The sticking regions of the etching product 22a, therefore, function as Faraday shield that interrupts capacitive coupling which changes plasma potential. The etching apparatus 10 according to the first embodiment, therefore, is equivalent to the configuration where a Faraday shield member is provided though it has no such configuration. Accordingly, in the etching apparatus 10 according to the first embodiment, the etching product 22a obtained in the processing can be utilized as a Faraday shield to stabilize the plasma potential, thus stabilizing the etching processing.

The etching apparatus 10 of the first embodiment gives the following advantages:

(1) A plurality of sticking regions to which the conductive etching product 22a is adhered and a plurality of high-frequency windows to which no conductive etching product 22a is adhered are formed on the inner surface of the reaction tube 14 by the shield plates 24 provided in the reaction tube 14. The high-frequency windows are formed so as to intersect with the coil antenna 23, that is, to be parallel to the center axis of the coil antenna 23. The high-frequency windows make it possible for the coil antenna 23 to efficiently feed high-frequency power into the reaction tube 14. Furthermore, the etching product 22a stuck to a plurality of sticking regions exhibits the Faraday shield effect. As a result, the plasma potential is stabilized to generate plasma in a stable manner, thus preventing the plasma from being ignited poorly and the etching rate from being lowered.

(2) The sloped segment 33 of the coil antenna 23 is arranged near the reaction tube 14 and rotated along the outer peripheral surface thereof so as to be capacitively coupled thereto. The reaction tube 14 has an ion sheath formed on its inner wall owing to capacitive coupling.

A majority of the ions in the plasma hit the wafer 22 to etch it. An etching product moves toward the inner surface of the reaction tube 14. Only a small amount of the ions move toward the coil antenna 23, that is, toward the inner surface of the reaction tube 14. The etching product hits the ions accelerated by the ion sheath to be diffused. As a result, less etching products stick to the inner surface of the reaction tube 14, thus making it possible to prolong a period for washing of the reaction tube 14.

(3) The sloped segment 33 is arranged closer to the reaction tube 14 than the first and second windings 31 and 32 are, thus making it possible to easily form a highly capacitive-coupling portion on the coil antenna 23. Furthermore, by rotating the coil antenna 23, the sloped segment 33 faces the reaction tube 14 throughout its overall inner-surface periphery and over a comparatively wide high range thereof. Accordingly, less etching product 22a sticks uniformly almost all over the inner surface of the reaction tube 14.

Figure 4:
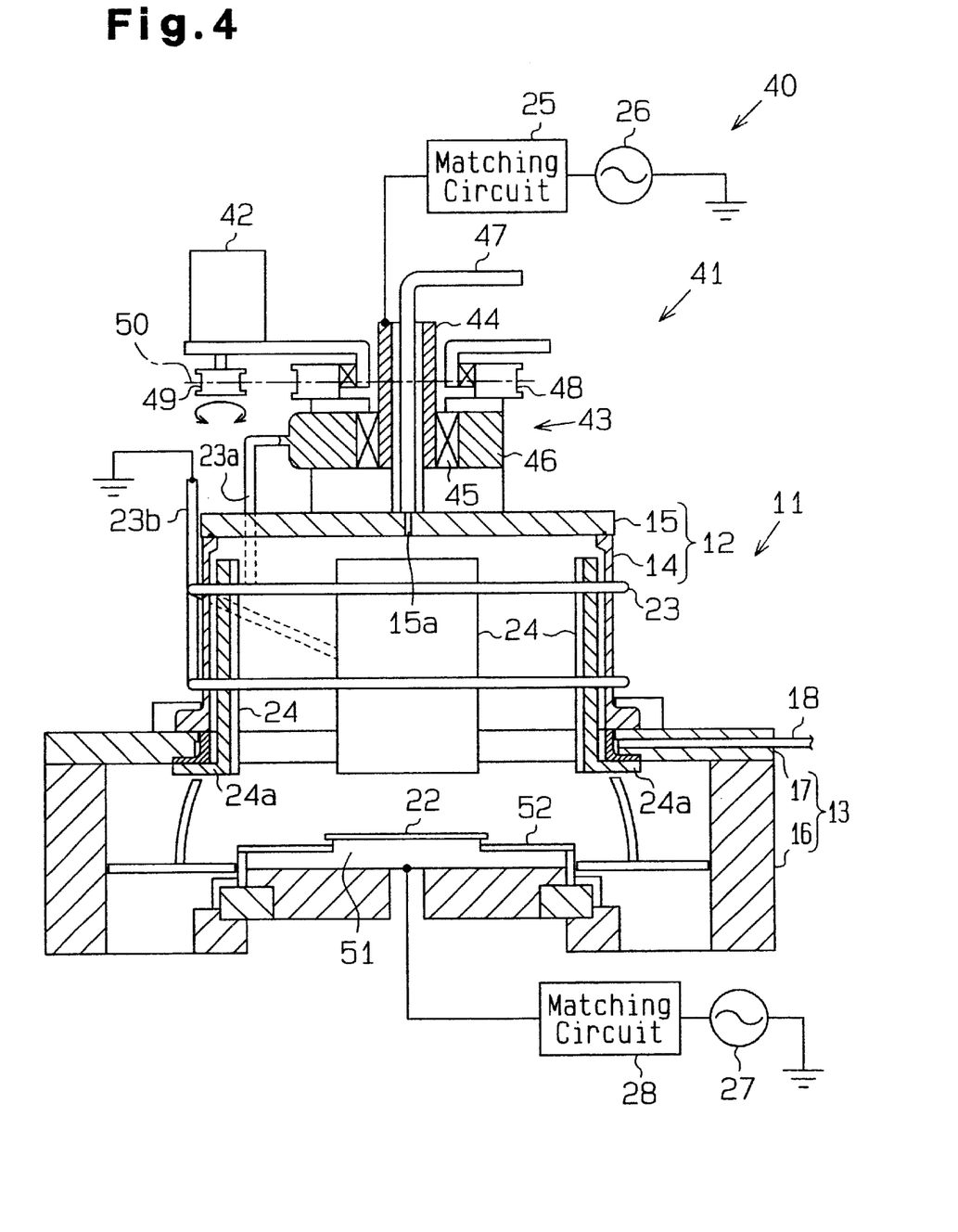
FIG. 4 is a schematic diagram of a plasma etching apparatus according to a second embodiment of the present invention.

The following will describe an ICP-type plasma etching apparatus 40 according to the second embodiment of the present invention with reference to FIG. 4. The same components of FIG. 4 as those of FIG. 1 are provided with the same reference numerals.

The etching apparatus 40 has a driving device 41 fixed to the cap 15 of the etching chamber 11. The driving device 41 comprises a motor 42 and a rotary connector 43 rotated thereby.

The rotary connector 43 is comprised of a hollow shaft 44, a bearing 45 fixed thereto, and a ring-shaped output unit 46 supported rotatably by the bearing 45. The hollow shaft 44 is fixed to the upper surface of the cap 15.

The hollow shaft 44 is connected via the matching circuit 25 to the first high-frequency power source 26, while the output unit 46 is connected to the coil antenna 23 at its power supply terminal 23a. In this configuration, the first high-frequency power source 26 feeds power to the coil antenna 23 through the matching circuit 25 and the rotary connector 43.

A gas introduction port 47 is inserted into the hollow shaft 44. The gas introduction port 47 communicates with the interior of the etching chamber 11 through a communication hole 15a formed in the cap 15. An etching gas is introduced into the etching chamber 11 through the gas introduction port 47 and the communication hole 15a. Furthermore, a temperature adjustment cable for adjustment of the temperature of the cap 15 is inserted into the gas introduction port 47.

A pulley 48 is fixed co-axially with the output unit 46. A timing belt 50 is stretched over between the pulley 48 and a pulley 49 fixed to the output shaft of the motor 42.

The lower processing chamber 13 is provided with a stage, that is, an electrostatic chuck 51, for fixing a sample to be etched, that is, the wafer 22, which electrostatic chuck 51 is connected via the matching circuit 28 to the second high-frequency power source 27 which feeds bias power.

The electrostatic chuck 51 is formed virtually into a disk-shape in the middle of which a mounting section is formed which has a diameter smaller than that of the wafer 22 and to the stepping outer periphery which serves as a step is fixed a nearly annular ring-shaped quartz plate 52 covering the outer periphery.

The following will describe actions of the etching apparatus 40 of the second embodiment.

A gas introduced through the gas introduction port 18 or 47 is controlled in the etching chamber 11 to provide a desired pressure atmosphere therein. When the gas atmosphere has been stabilized in the etching chamber 11, electric power is fed from the first high-frequency power source 26 to the coil antenna 23, so that an electromagnetic wave oscillated by the coil antenna 23 passes through the reaction tube 14 to ionize gas molecules, and atoms, thus providing a plasma state in the etching chamber 11.

Upon oscillation by the first high-frequency power source 26, a controller, not shown, activates the motor 42, thus rotating the pulley 48 through the timing belt 50. When the pulley 48 rotates, the coil antenna 23 fixed to the rotary connector 43 rotates in turn.

When the plasma is stabilized and a sufficient amount of ions is generated, the second high-frequency power source 27 feeds electric power, so that the wafer 22 is etched off due to the ion assist reaction or the ion bombardment.

The etching product mostly collides with the ions accelerated by the ion sheath caused by capacitive coupling of the coil antenna 23 and is diffused. As a result, less etching products stick to the vicinity of the coil antenna 23.

In addition to the above-mentioned advantages (1) through (3), the etching apparatus 40 of the second embodiment 40 gives the following advantages:

(4) The pulley 48 is fixed co-axially with the rotary connector 43, so that the motor 42 rotates the rotary connector 43 through the pulley 48. In this configuration, the coil antenna 23 fixed to the rotary connector 43 is rotated accurately along the outer periphery of the reaction tube 14, thus suppressing fluctuations in deposition rate of the etching product 22a sticking to the reaction tube 14.

(5) By using the rotary connector 43 having the hollow shaft 44, it is possible to adjust the temperature of the cap 15 and introduce the gas into the etching chamber 11 from the above.

It should be apparent to those skilled in the art that the present invention may be embodied in many other specific forms without departing from the spirit or scope of the invention. Particularly, it should be understood that the invention may be embodied in the following forms.

The shape of the coil antenna 23 can be changed.

Figure 5A:
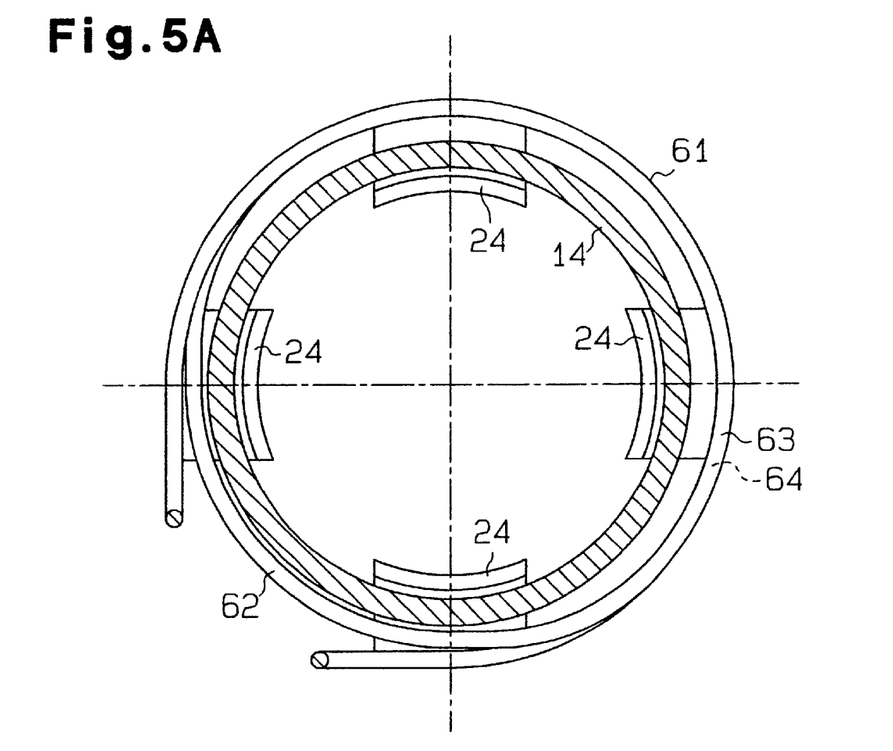
Figure 5B:
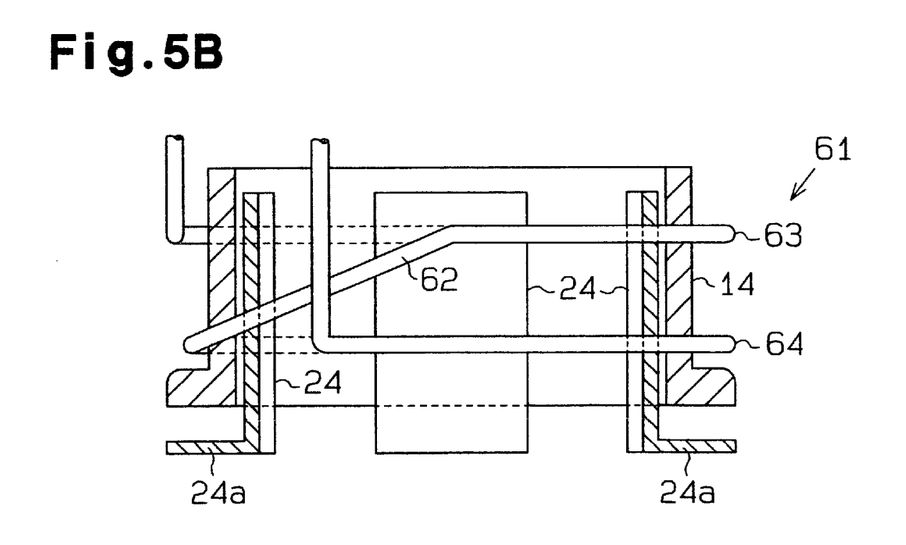

For example, a coil antenna 61 as shown in FIGS. 5A and 5B can be used.

The coil antenna 61 comprises a sloped segment 62 coming near the outer peripheral surface of the reaction tube 14 and upper and lower windings 63 and 64 which continue from the sloped segment 62. The upper and lower windings 63 and 64 are separated from the outer peripheral surface of the reaction tube 14 by a first distance. The sloped segment 62 is arranged so that the distance between the sloped segment 62 and the outer peripheral surface of the reaction tube 14 may smoothly shift from the first distance to the second distance by which it is most approximate the outer peripheral surface of the reaction tube 14. Since the coil antenna 61 has almost the same advantages as the coil antenna 23, it is possible to make the magnitude of capacitive coupling larger at the sloped segment 62 than at the first and second windings 63 and 64, thus reducing the amount of the etching product stuck to the reaction tube 14.

Figure 6A:
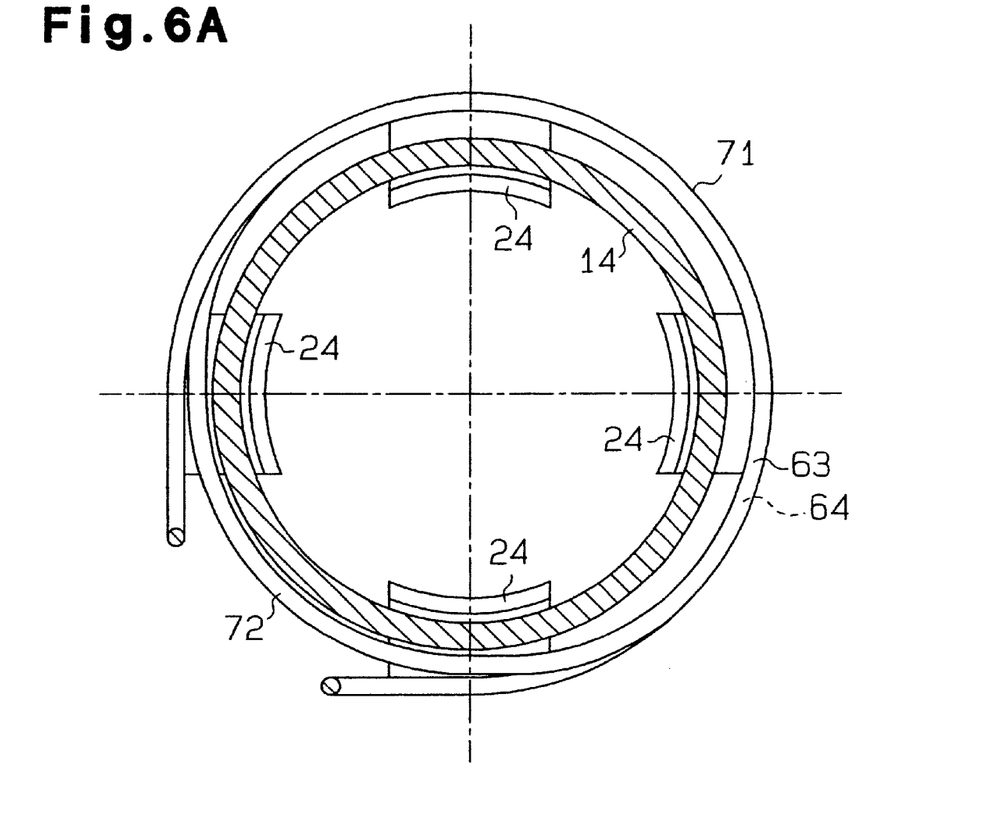
Figure 6B:
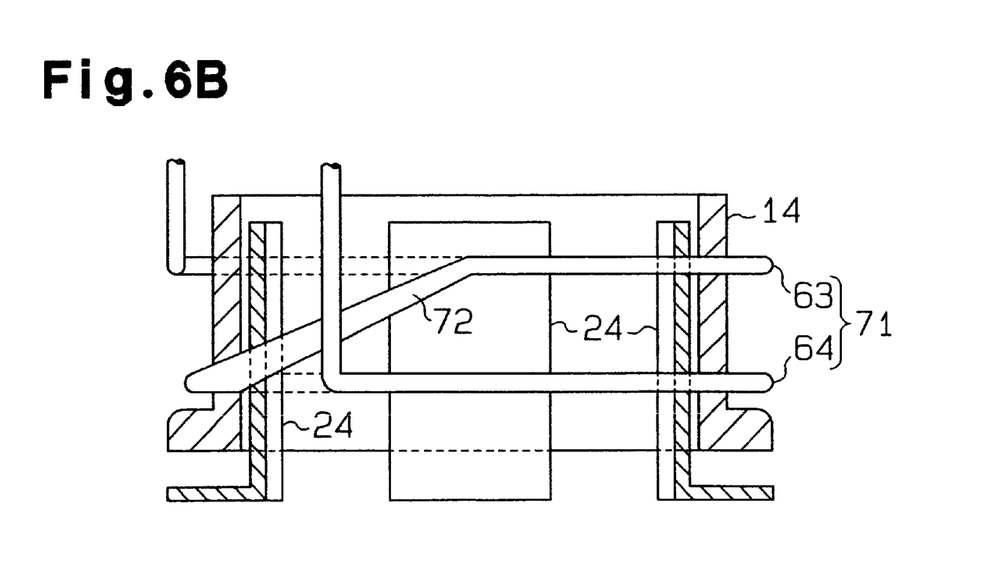

A coil antenna 71 as shown in FIGS. 6A and 6B can be used. An sloped segment 72 of the coil antenna 71 becomes gradually wider as it goes from the upper winding 63 to the lower winding 64. This causes the capacitive coupling to be uniformly distributed between the coil antenna 71 and the reaction tube 14. As a result, the deposition rate of the etching product is reduced and its depositing distribution becomes uniform, so that the etching product will not readily peel off once deposited.

There is used a coil antenna which is formed such that an area to be projected onto the reaction tube 14 increases gradually from the power supply terminal to the grounding terminal.

Figure 7A:
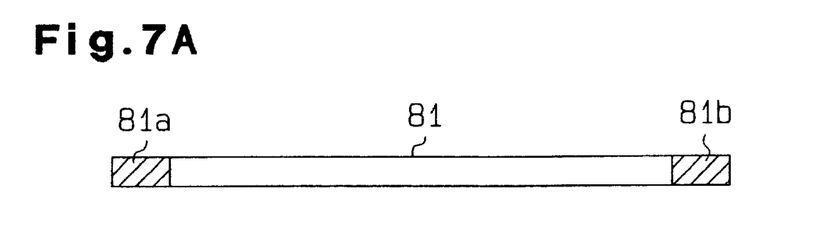
Figure 7B:
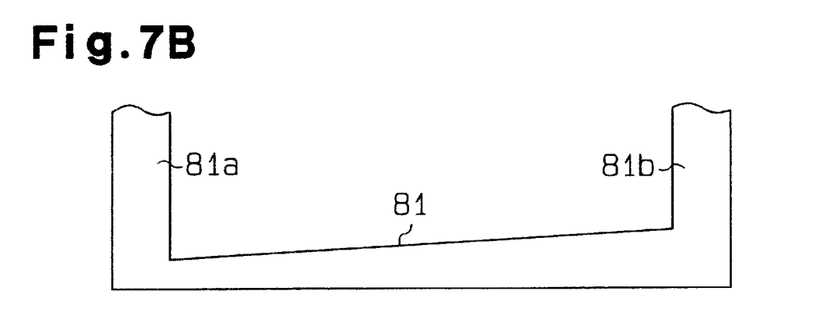

For example, an antenna plate 81 shown in FIGS. 7A and 7B is prepared. The antenna plate 81 has a uniform thickness and is formed so as to grow thicker gradually from its power supply terminal 81a to its grounding terminal 81b. The antenna plate 81 can be wound around the outer periphery of the reaction tube 14 by about two turns so as to be used as a coil antenna.

Figure 8A:
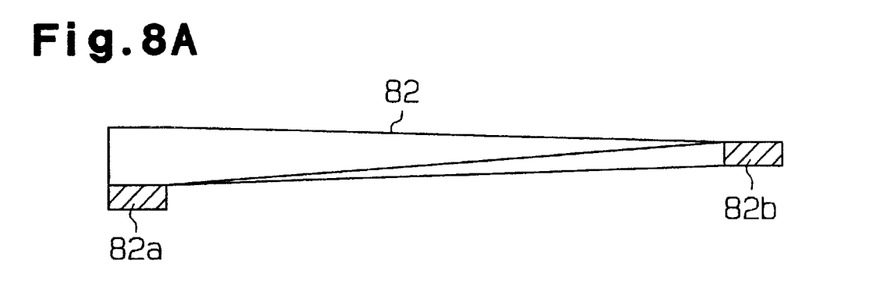
Figure 8B:
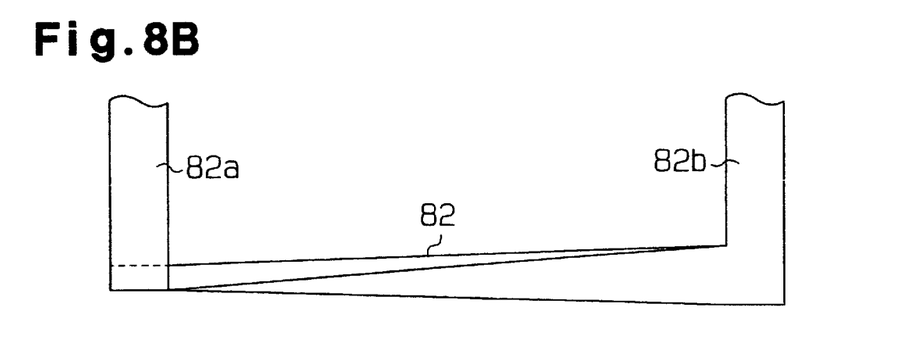

Alternatively, as shown in FIGS. 8A and 8B, an antenna plate 82 having uniform thickness and width, can be twisted by 90 degrees and then wound around the outer periphery of the reaction tube 14 by about two turns equidistantly with respect to its outer peripheral surface so as to be used as a coil antenna.

As for the coil antenna formed by winding the antenna plate 81 or 82 around it by about two turns, its projection area onto the reaction tube 14 increases gradually from the power supply terminal 81a or 82a to the grounding terminal 81b or 82b, so that the capacitive coupling is distributed uniformly. Accordingly, the deposition rate of the etching product is reduced and its deposition distribution is also made uniform, so that it will not easily peel off.

As described above, by bringing the coil antenna 23 close to the reaction tube 14 or by increasing the area to be projected onto the reaction tube 14, the size of the ion sheath is changed. It is thus possible to reduce the rate at which the product is stuck corresponding to a difference in sticking amount of the product caused by a difference in etching material or etchant type, thereby enabling to prolong a period for washing of the reaction tube 14.

The shape of the shield plates 24 can be changed.

Figure 9A:
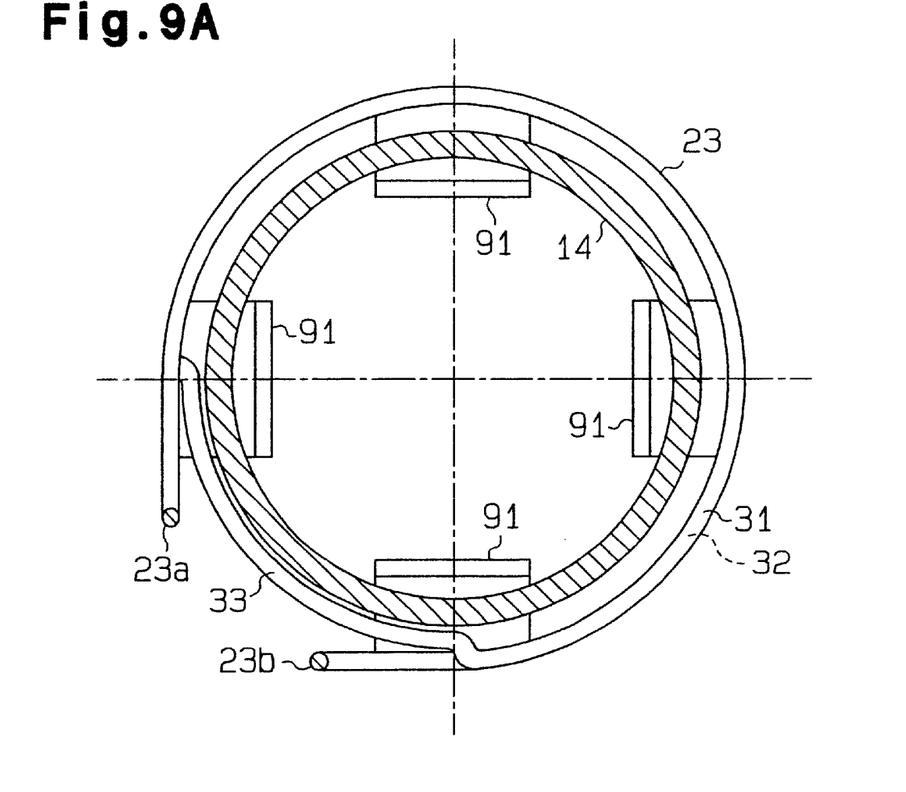
Figure 9B:
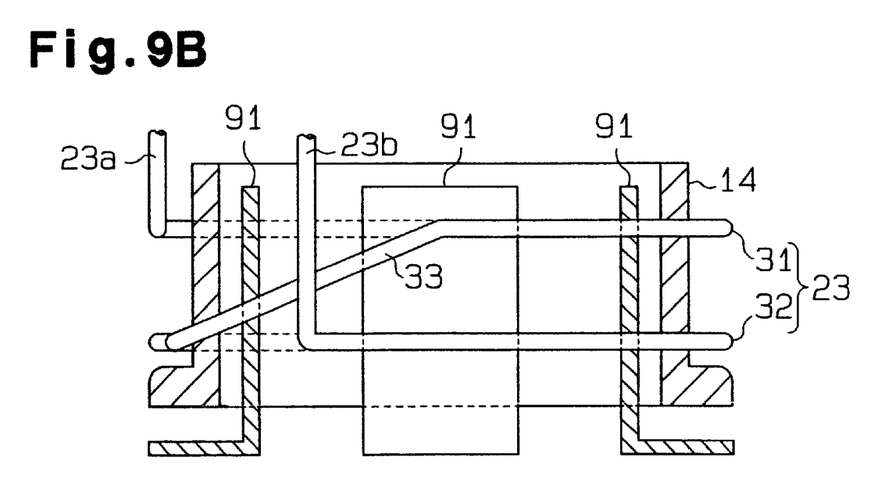

For example, as shown in FIGS. 9A and 9B, a flat shield plate 91 can be used. Preferably, the shield plates 91 are each arranged so as to be perpendicular to a plane including the center axis of the reaction tube 14.

Figure 10A:
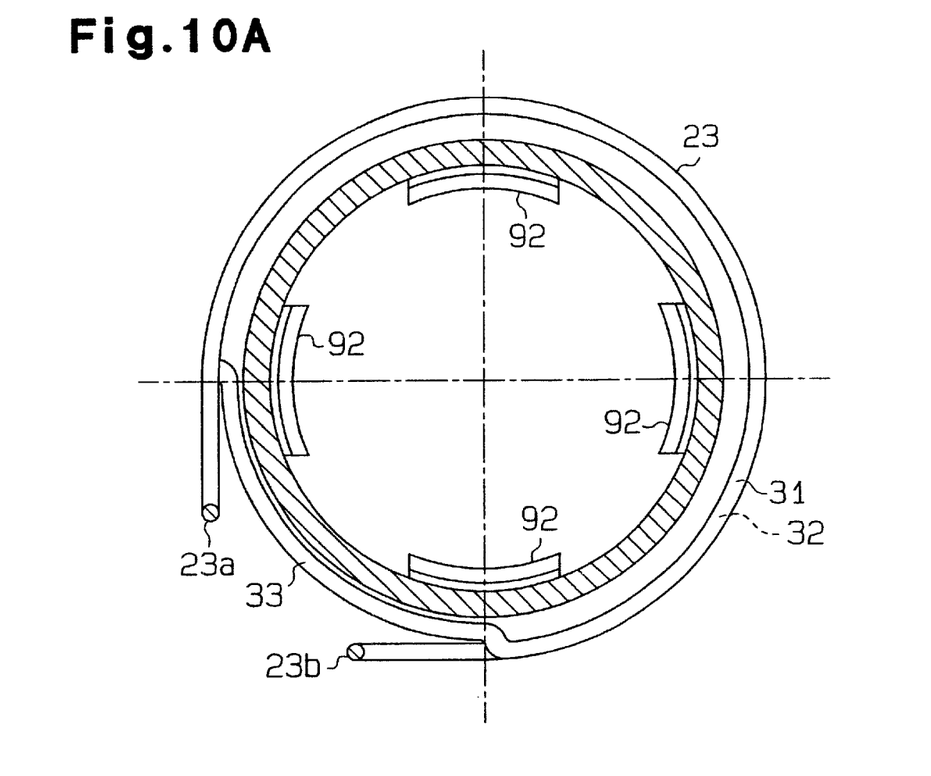
Figure 10B:
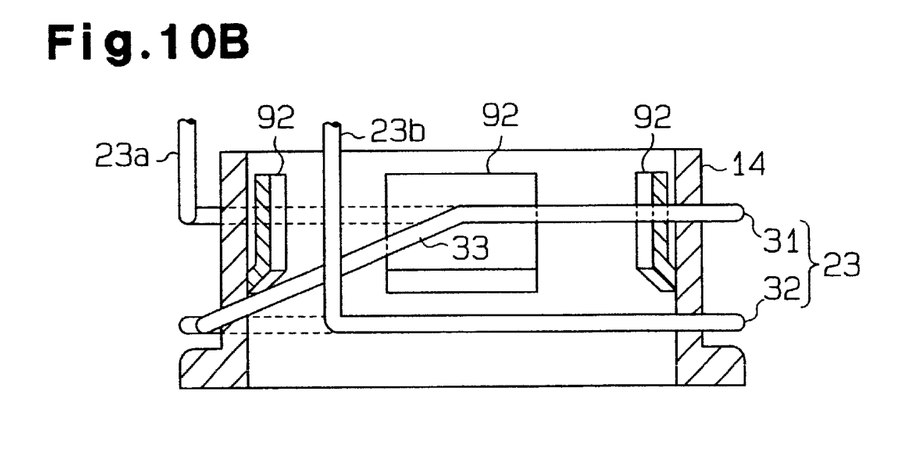

As shown in FIGS. 10A and 10B, there can be used a shield plate 92 which is arranged only at the height of the first winding 31 that extends to the power supply terminal 23a. The shield plate 92 can be flat as shown in FIG. 9A.

The coil antennas 23, 61, 71, 81, and 82 can be used in an apparatus for using generated plasma to perform predetermined processing on a sample (for example, inductively coupled plasma enhanced CVD apparatus).

They can be embodied in an etching apparatus or a chemical vapor deposition (CVD) apparatus used in a manufacturing process for a liquid crystal display (LCD) or a thin film magnetic-head (TFH) rather than on the wafer 22.

In place of rotating the coil antenna 23 around the invariable reaction tube 14, the reaction tube 14 can be rotated with the coil antenna 23 as fixed thereto. The coil antenna 23 and the reaction tube 14 can be rotated horizontally together.

The coil antenna 23 can be moved vertically instead of rotating horizontally. Furthermore, the coil antenna 23 can be moved vertically as rotating horizontally.

The moving speed of the coil antenna 23 can be controlled variably by the controller 30. This enables reducing the deposition rate corresponding to the properties of the etching product.

The coil antenna 23 can be wound roughly one turn or by three turns or more.

The first and second windings of the coil antenna 23 can be separated from the reaction tube 14 by different distances. For example, the first winding 31 can be separated from the coil antenna 23 more than the second winding 32. In such a case, the first and second windings 31 and 32 can have roughly the same magnitude of capacitive coupling, thus making uniform the deposition rate of the etching product.

The upper processing chamber 12 can be formed of a hanging bell shaped quartz bell jar.

A coil antenna with capacitive coupling yet to be adjusted can be used.

The shield plates 24, 91, and 92 can be applied to a thin film formation apparatus such as a chemical vapor deposition (CVD) apparatus or a physical vapor deposition (PVD) apparatus. Furthermore, the coil antenna 23 according to the above-mentioned embodiments can be applied to the various thin film formation apparatuses.

The number of the shield plates 24 used is not limited to four but can be at least one, two, six, or eight.

Therefore, the present examples and embodiments are to be considered as illustrative and not restrictive and the invention is not to be limited to the details given herein, but may be modified within the scope and equivalence of the appended claims.

What is claimed is:

1. An inductively coupled plasma apparatus comprising:
   a reaction tube made of a dielectric material and having at least curved outer and inner surfaces;
   a high-frequency antenna arranged around the reaction tube, for generating plasma inside the reaction tube; and
   at least one shield plate arranged in the reaction tube for splitting a deposition layer composed of reaction product particles to be attached on the reaction tube.

2. The plasma apparatus according to claim 1, wherein the shield plate is provided to intersect with the high-frequency antenna.

3. The plasma apparatus according to claim 1, wherein the high-frequency antenna has a power supply terminal and a first winding which continues to the power supply terminal, wherein the shield plate faces the first winding of the high-frequency antenna.

4. The plasma apparatus according to claim 1, wherein the high-frequency antenna has a power supply terminal, a plurality of windings including a first winding which continues to the power supply terminal, and a sloped segment which interconnects the windings in such a configuration that the windings are arranged nearly parallel to each other and that the shield plate is arranged so as to locally stick to the inner surface of the reaction tube near at least the first winding.

5. The plasma apparatus according to claim 1, wherein the shield plate is curved along the inner surface of the reaction tube.

6. The plasma apparatus according to claim 1, wherein the shield plate is a flat plate which intersects perpendicularly with a plane including the center axis of the reaction tube and is arranged parallel with the center axis of the reaction tube.

7. The plasma apparatus according to claim 1, wherein one component of the high-frequency antenna is arranged closer to the reaction chamber than the components other than the one component.

8. The plasma apparatus according to claim 1, further comprising a driving device for moving at least one of the high frequency antenna and the reaction tube relative to the other.

9. The plasma apparatus according to claim 1, wherein the shield plate is one of a plurality of shield plates arranged separate from each other in a circumferential direction of the reaction tube.

10. The plasma apparatus according to claim 1, wherein the shield plates are four shield plates arranged equidistantly from each other in the circumferential direction of the reaction tube.

11. A plasma etching apparatus comprising:
a cylindrical reaction tube made of a dielectric material;
a high-frequency antenna arranged to face an outer peripheral surface of the reaction tube, for generating plasma inside the reaction tube;
a plurality of shield plates which are arranged to be near an inner peripheral surface of the reaction tube so as to face at least part of the high-frequency antenna and are arranged separate from each other; and
a driving device for moving at least one of the high frequency antenna and the reaction tube relative to the other.

12. The plasma etching apparatus according to claim 11, wherein a plurality of the shield plates are arranged equidistantly from each other in a circumferential direction of the reaction tube.

13. The plasma etching apparatus according to claim 11, wherein the high-frequency antenna has a power supply terminal, a first winding which continues to the power supply terminal, a second winding arranged roughly parallel to the first winding, and a sloped segment which interconnects the first and second windings in such a configuration that a plurality of the shield plates are arranged to face at least the first winding.

14. The plasma etching apparatus according to claim 13, wherein the first and second windings are arranged horizontally and the shield plates are arranged vertically.

15. The plasma etching apparatus according to claim 14, wherein each of the shield plates is curved along the inner surface of the reaction tube.

16. The plasma etching apparatus according to claim 14, wherein each of the shield plate is a flat plate which intersects perpendicularly with a plane including the center axis of the reaction tube and is arranged parallel with the center axis of the reaction tube.

17. The plasma etching apparatus according to claim 11, wherein the plasma apparatus is an inductively coupled plasma etching apparatus.

18. A plasma etching apparatus comprising:
a cylindrical reaction tube made of a dielectric material;
a high-frequency antenna arranged to face an outer peripheral surface of the reaction tube, for generating plasma inside the reaction tube; and
a plurality of shield plates arranged to face a plurality of first regions on the inner peripheral surface of the reaction tube for splitting a deposition layer composed of etching product particles to be attached on the reaction tube into a plurality of first deposition layers deposited over the shield plates and a plurality of second deposition layers deposited over a plurality of second regions of the reaction tube except for the first regions.

* * * * *